United States Patent
Chen et al.

(10) Patent No.: US 10,743,424 B2
(45) Date of Patent: Aug. 11, 2020

(54) METHOD FOR MANUFACTURING FLEXIBLE ARRAY SUBSTRATE

(71) Applicant: Shenzhen China Star Optoelectronics Technology Co., Ltd., Shenzhen (CN)

(72) Inventors: Lixuan Chen, Shenzhen (CN); Yungjui Lee, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 349 days.

(21) Appl. No.: 15/548,103

(22) PCT Filed: Jun. 20, 2017

(86) PCT No.: PCT/CN2017/089266
§ 371 (c)(1),
(2) Date: Aug. 2, 2017

(87) PCT Pub. No.: WO2018/214206
PCT Pub. Date: Nov. 29, 2018

(65) Prior Publication Data
US 2018/0343750 A1    Nov. 29, 2018

(30) Foreign Application Priority Data

May 23, 2017 (CN) .......................... 2017 1 0370204

(51) Int. Cl.
*H05K 3/46* (2006.01)
*H05K 3/00* (2006.01)
(Continued)

(52) U.S. Cl.
CPC ....... *H05K 3/4691* (2013.01); *G02F 1/13454* (2013.01); *G02F 1/133305* (2013.01);
(Continued)

(58) Field of Classification Search
CPC ........ H05K 3/4691; H05K 3/007; H05K 3/28; H05K 1/115; H05K 1/189; H05K 1/0281;
(Continued)

(56) References Cited

U.S. PATENT DOCUMENTS 5,231,751 A * 8/1993 Sachdev ............... H01L 21/486
216/18
5,321,210 A * 6/1994 Kimbara ............. H01L 21/4857
174/256

(Continued)

FOREIGN PATENT DOCUMENTS

CN      203012296 U    6/2013
CN      103217845 A    7/2013
(Continued)

*Primary Examiner* — Peter Dungba Vo
*Assistant Examiner* — Jeffrey T Carley
(74) *Attorney, Agent, or Firm* — Leong C. Lei

(57) ABSTRACT

The present invention provides a method for manufacturing a flexible array substrate. The method includes, first, successively forming an adhesive layer, a passivation layer, a back-side drive circuit, a planarization layer, a flexible backing plate, and a front-side drive circuit and a display circuit, in a stacked arrangement, on a rigid support plate and then peeling off the rigid support plate and the adhesive layer to form a flexible array substrate having a double-sided circuit structure. The entire process requires no steps of peeling, reversing, and then re-attaching of the flexible backing plate so that it is possible to avoid the issues of poor flatness and low yield resulting from improper or wrongful re-attachment of the flexible backing plate and thus, fabrication difficulty of a flexible array substrate having a double-sided circuit structure may be lowered down to thereby improve fabrication yield of the flexible array substrate.

10 Claims, 7 Drawing Sheets

(51) Int. Cl.
*G02F 1/1345* (2006.01)
*G02F 1/1333* (2006.01)
*H05K 1/11* (2006.01)
*H05K 3/02* (2006.01)
*H05K 3/40* (2006.01)

(52) U.S. Cl.
CPC ............. *H05K 1/115* (2013.01); *H05K 3/007* (2013.01); *H05K 3/025* (2013.01); *H05K 3/027* (2013.01); *H05K 3/4053* (2013.01); *G02F 2201/42* (2013.01); *H05K 2201/10128* (2013.01)

(58) Field of Classification Search
CPC .... H05K 2201/10128; G02F 1/133305; G02F 1/1345; G09F 9/301
See application file for complete search history.

(56) References Cited

U.S. PATENT DOCUMENTS

| | | | | |
|---|---|---|---|---|
| 8,367,473 | B2 * | 2/2013 | Huang | H01L 24/32 438/110 |
| 8,768,062 | B2 * | 7/2014 | Lakshmanan | G06K 9/00409 382/186 |
| 2001/0040645 | A1 * | 11/2001 | Yamazaki | G02F 1/133305 349/42 |
| 2003/0025118 | A1 * | 2/2003 | Yamazaki | H01L 51/529 257/79 |
| 2007/0207571 | A1 * | 9/2007 | Morisue | H01L 27/1214 438/107 |
| 2008/0171484 | A1 * | 7/2008 | Yamashita | G02F 1/133305 445/24 |
| 2010/0289132 | A1 * | 11/2010 | Huang | H01L 21/4846 257/690 |
| 2011/0084370 | A1 * | 4/2011 | Su | H01L 21/6835 257/669 |
| 2011/0101512 | A1 * | 5/2011 | Choi | H01L 24/29 257/686 |
| 2011/0285007 | A1 * | 11/2011 | Chi | H01L 21/4846 257/686 |
| 2015/0282395 | A1 * | 10/2015 | Raorane | H01L 23/5389 361/679.02 |
| 2015/0333221 | A1 * | 11/2015 | Bibl | G09F 9/301 257/88 |

FOREIGN PATENT DOCUMENTS

| | | |
|---|---|---|
| CN | 105632347 A | 6/2016 |
| CN | 106063393 A | 10/2016 |
| CN | 106530972 A | 3/2017 |
| JP | 2013038229 A | 2/2013 |

* cited by examiner

METHOD FOR MANUFACTURING FLEXIBLE ARRAY SUBSTRATE

BACKGROUND OF THE INVENTION

1. Field of the Invention

The present invention relates to the field of display technology, and more particular to a method for manufacturing a flexible array substrate.

2. The Related Arts

With the progress of the display technology, flat panel displays, such as liquid crystal displays (LCDs) and organic light emitting diode (OLED) displays, due to various advantages, such as high image quality, low power consumption, thin device body, and wide applications, have been widely used in various consumer electronic products, such as mobile phones, televisions, personal digital assistants, digital cameras, notebook computers, and desktop computers and are now the mainstream of the display devices.

Referring to FIG. 1, a known liquid crystal display generally comprises: a display panel 100, source drive chips 200 electrically connected to an upper side of the display panel 100, gate drive chips 400 electrically connected to left and right sides of the display panel 100, and a drive circuit board 300 electrically connected to the source drive chips 200 and gate drive chips 400. The display panel 100 comprises a display zone 101 and a non-display zone 102 surrounding the display zone 101. The display zone 101 is provided therein with a plurality of parallel and spaced gate lines that are horizontally arranged and a plurality of parallel and spaced source lines that are arranged vertically. The non-display zone is provided therein with a plurality of wire on array (WOA) lines 500 arranged in a fan configuration. The WOA lines 500 connect the plurality of gate lines to the gate drive chips 400 and also connect the plurality of source lines to the source drive chips 200.

With the progress of display devices, "ultra-slim bezel" or "bezel-free" become a new trend. The ultra-slim bezel or the bezel-free displaying both provide better experiences of the outside appearance. However, due to the inevitable existence of WOA lines on a periphery of the display zone of a display panel, the distance between the display zone of the display panel and a peripheral edge is increased, making it hard to achieve bezel-free displaying or ultra-slim bezel. Particularly, with the resolution of a display panel increasing from high definition to ultra-high definition or even higher, an increased space is necessary for disposition of the WOA lines and this makes it even harder to further narrow the bezel area. Further, with the development of the display technology, it has also been proposed to use gate driver on array (GOA) technique to replace the gate drive chips. In such a case, the GOA circuit is directly made in the non-display zone of a display panel and is directly connected to the gate lines; however, this does not allow for omission of the WOA lines, for the WOA lines are necessary for electrically connecting a drive circuit board and the GOA circuit. Although the gate drive chips may be removed, the GOA circuit still occupies a certain widthwise area of the non-display zone. Particularly, when the resolution of the display panel is increased from high definition to ultra-high definition or even higher, the required number of stages of the GOA circuits would also increase. The width of a display panel is generally a fixed parameter, and consequently, the width of the non-display zone must be expanded in order to accommodate the increased numbers of thin-film transistors and circuit circuits that make up the increased number of GOA circuits. The GOA circuits and the WOA lines occupy a laying area that may becomes excessively large, this being adverse to ultra-slim bezel or bezel-free displaying.

To cope with such problems, a prior art solution is a double-sided circuit structure, and specifically, front and back surfaces of a flexible backing plate are both formed with circuits and holes are formed in the flexible backing plate to connect the circuits on the front and back surfaces. A manufacturing method is as follows. Firstly, a flexible backing plate is formed on a rigid base plate and then, a circuit layer is formed on the flexible backing plate. The flexible backing plate is peeled off and turned over to re-attach to the rigid base plate for subsequently forming a circuit on the opposite surface of the flexible backing plate. In such a manufacturing process, the flexible backing plate must be first peeled off and then re-attached. In the state of the art technology, even non laser based peeling processes, such as temperature controllable adhesives, are applied, it is still possible to cause issues of poor flatness resulting from incorrect attachment. This makes the fabrication of the double-sided circuit structure difficult and the yield is low.

SUMMARY OF THE INVENTION

An objective of the present invention is to provide a method for manufacturing a flexible array substrate, which helps reduce fabrication difficulty of a flexible array substrate having a double-sided circuit structure and improves yield of fabrication of array flexible substrates.

To achieve the above objective, the present invention provides a method for manufacturing a flexible array substrate, which comprises the following steps:

Step S1: providing a rigid support plate, forming an adhesive layer on the rigid support plate, and forming a passivation layer on the adhesive layer;

Step S2: forming a back-side drive circuit on the passivation layer and covering the back-side drive circuit with a planarization layer;

Step S3: forming a flexible backing plate on the planarization layer;

Step S4: forming a via in the flexible backing plate to extend through the flexible backing plate and the planarization layer;

Step S5: forming a front-side drive circuit and a display circuit that is in electrical connection with the front-side drive circuit on the flexible backing plate, such that the front-side drive circuit is electrically connected, through the via, to the back-side drive circuit; and Step S6: peeling off the rigid support plate and the adhesive layer to obtain a flexible array substrate.

The rigid support plate is made of a material of glass.

The flexible backing plate is made of a material comprising polyimide, polyethylene terephthalate, cyclic olefin copolymer, or polyethersulfone resin.

The flexible backing plate has a thickness of 5-500 micrometers.

Step S4 uses an operation of laser drilling or chemical corrosion to form the via.

The via has a diameter of 5-100 micrometers.

Step S6 uses an operation of laser peeling to peel off the rigid support plate and the adhesive layer.

Step S3 uses an operation of coating or attachment to form the flexible backing plate on the planarization layer.

The front-side drive circuit and the back-side drive circuit collectively form wire-on-array (WOA) line of the flexible array substrate.

The front-side drive circuit and the back-side drive circuit collectively form WOA lines and a gate-driver-on-array (GOA) circuit of the flexible array substrate.

The present invention also provides a method for manufacturing a flexible array substrate, which comprises the following steps:

Step S1: providing a rigid support plate, forming an adhesive layer on the rigid support plate, and forming a passivation layer on the adhesive layer;

Step S2: forming a back-side drive circuit on the passivation layer and covering the back-side drive circuit with a planarization layer;

Step S3: forming a flexible backing plate on the planarization layer;

Step S4: forming a via in the flexible backing plate to extend through the flexible backing plate and the planarization layer;

Step S5: forming a front-side drive circuit and a display circuit that is in electrical connection with the front-side drive circuit on the flexible backing plate, such that the front-side drive circuit is electrically connected, through the via, to the back-side drive circuit; and Step S6: peeling off the rigid support plate and the adhesive layer to obtain a flexible array substrate;

wherein the flexible backing plate is made of a material comprising polyimide, polyethylene terephthalate, cyclic olefin copolymer, or polyethersulfone resin; and wherein the flexible backing plate has a thickness of 5-500 micrometers.

The efficacy of the present invention is that the present invention provides a method for manufacturing a flexible array substrate. The method comprises, first, successively forming an adhesive layer, a passivation layer, a back-side drive circuit, a planarization layer, a flexible backing plate, and a front-side drive circuit and a display circuit, in a stacked arrangement, on a rigid support plate and then peeling off the rigid support plate and the adhesive layer to form a flexible array substrate having a double-sided circuit structure. The entire process requires no steps of peeling, reversing, and then re-attaching of the flexible backing plate so that it is possible to avoid the issues of poor flatness and low yield resulting from improper or wrongful re-attachment of the flexible backing plate and thus, fabrication difficulty of a flexible array substrate having a double-sided circuit structure may be lowered down to thereby improve fabrication yield of the flexible array substrate.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
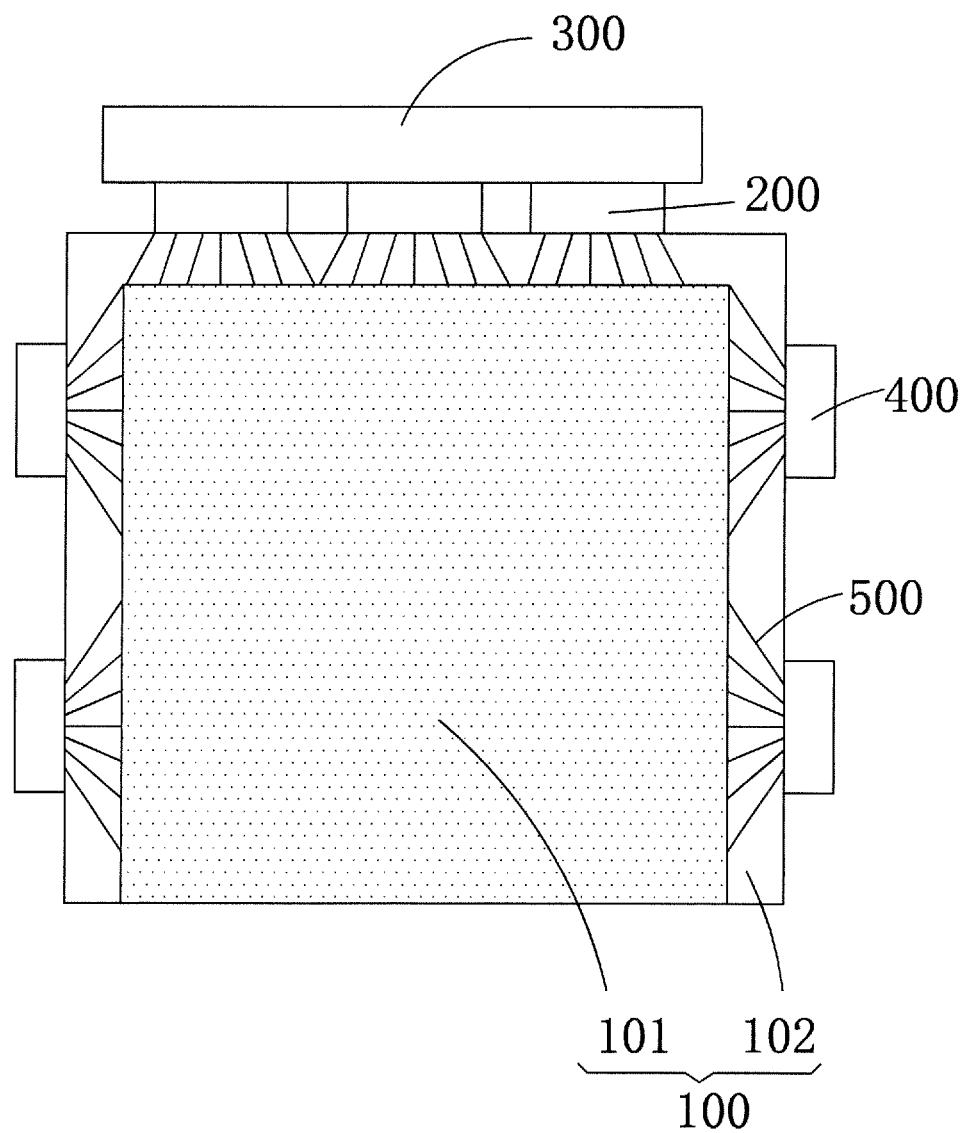
FIG. 1 is a schematic view illustrating a structure of a known liquid crystal display.
Figure 2:
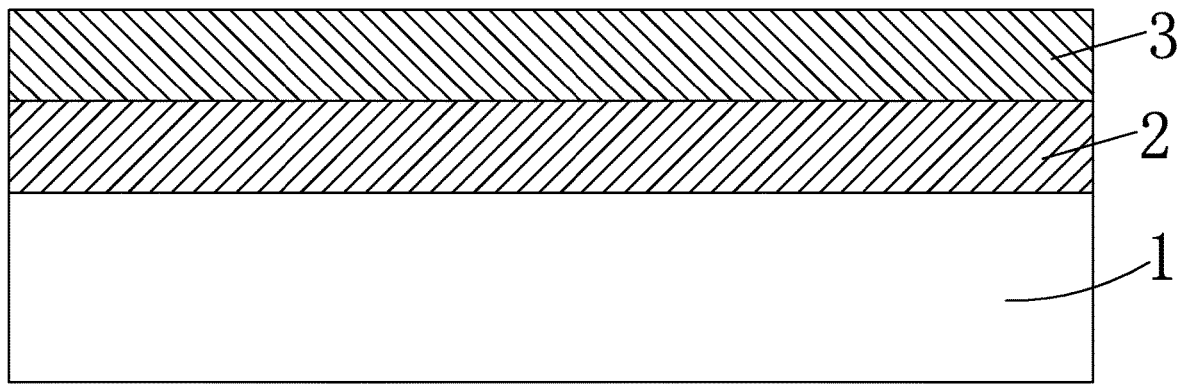
FIG. 2 is a schematic view illustrating Step S1 of a method for manufacturing a flexible array substrate according to the present invention.
Figure 8:
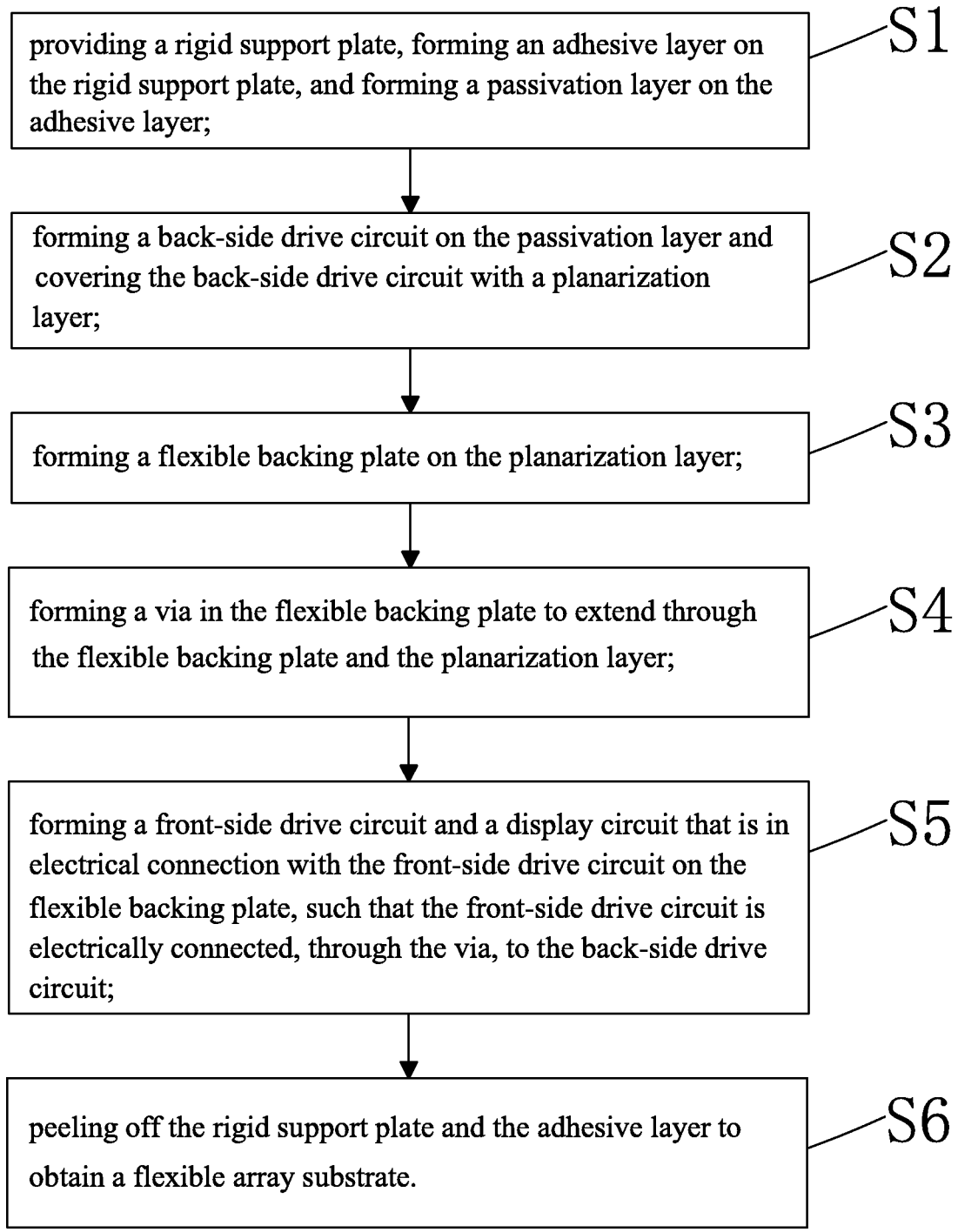
FIG. 8 is a flow chart illustrating the method for manufacturing a flexible array substrate according to the present invention.

Referring to FIG. 8, the present invention provides a method for manufacturing a flexible array substrate, which comprises the following steps:

Step S1: referring to FIG. 2, providing a rigid support plate 1, forming an adhesive layer 2 on the rigid support plate 1, and forming a passivation layer 3 on the adhesive layer 2.

Specifically, the rigid support plate 1 is made of a material of glass. The adhesive layer 2 is made of an adhesive material that is selected as pressure-sensitive adhesive or temperature controllable adhesive. The passivation layer 3 is made of a material comprising an inorganic material, such as silicon oxide (SiOx) and silicon nitride (SiNx) formed through physical vapor deposition (PVD), or alternatively comprising an organic material, such as polyfluoroalkoxy (PFA) formed through chemical vapor deposition (CVD). The passivation layer 3 is provided for protection of a back-side drive circuit 4 that is formed subsequently.

Figure 3:
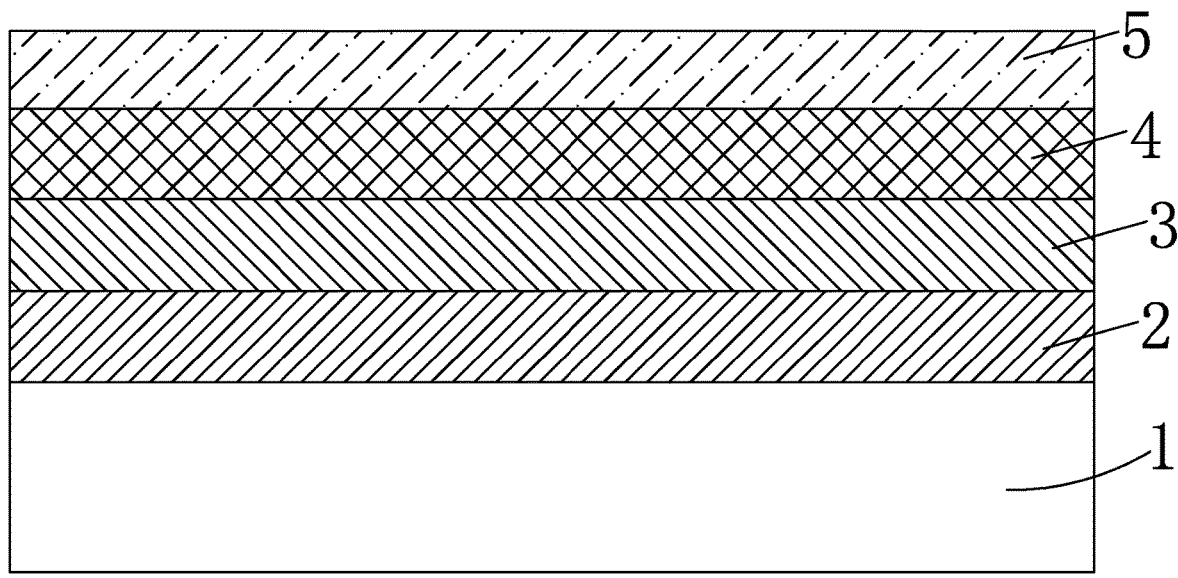
FIG. 3 is a schematic view illustrating Step S2 of the method for manufacturing a flexible array substrate according to the present invention.

Step S2: referring to FIG. 3, forming a back-side drive circuit 4 on the passivation layer 3 and covering the back-side drive circuit 4 with a planarization layer 5.

Figure 4:
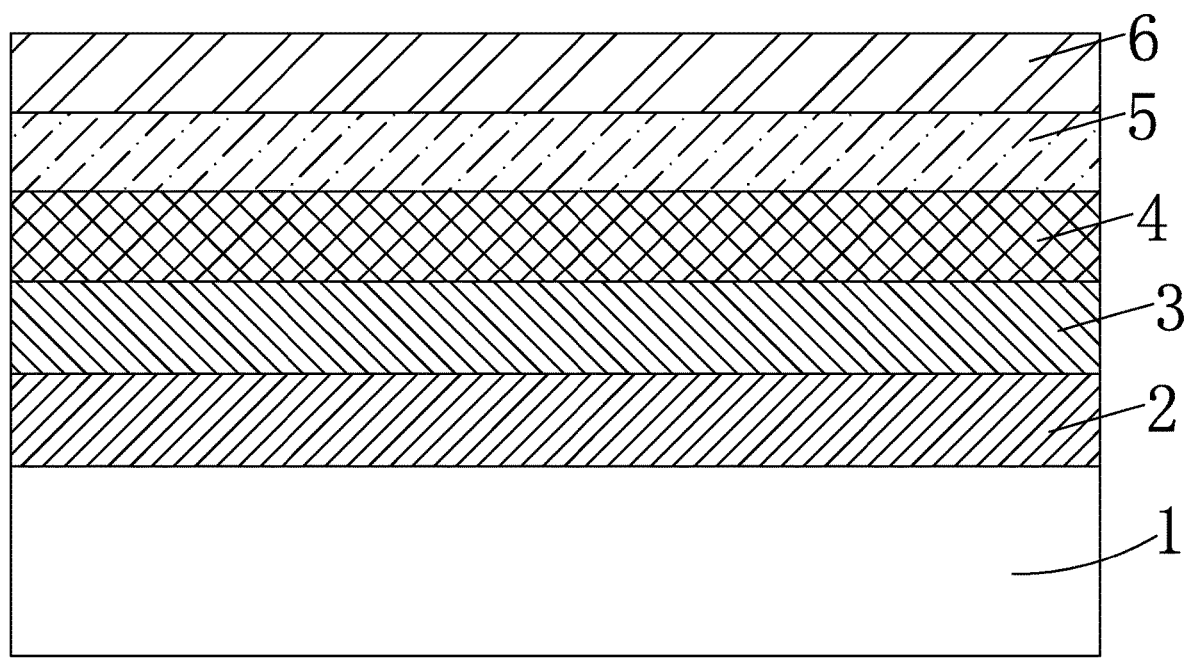
FIG. 4 is a schematic view illustrating Step S3 of the method for manufacturing a flexible array substrate according to the present invention.

Step S3: referring to FIG. 4, forming a flexible backing plate 6 on the planarization layer 5.

Specifically, the flexible backing plate 6 is made of a material comprising polyimide (PI), polyethylene terephthalate (PET), cyclic olefin copolymer (COC), or polyethersulfone resin (PES) and the flexible backing plate 6 is formed through coating or attachment in order to facilitate subsequent performance of a perforation operation. The flexible backing plate 6 has a thickness that should not be excessively large and preferably, the thickness of the flexible backing plate 6 is in the range of 5-500 micrometers.

Figure 5:
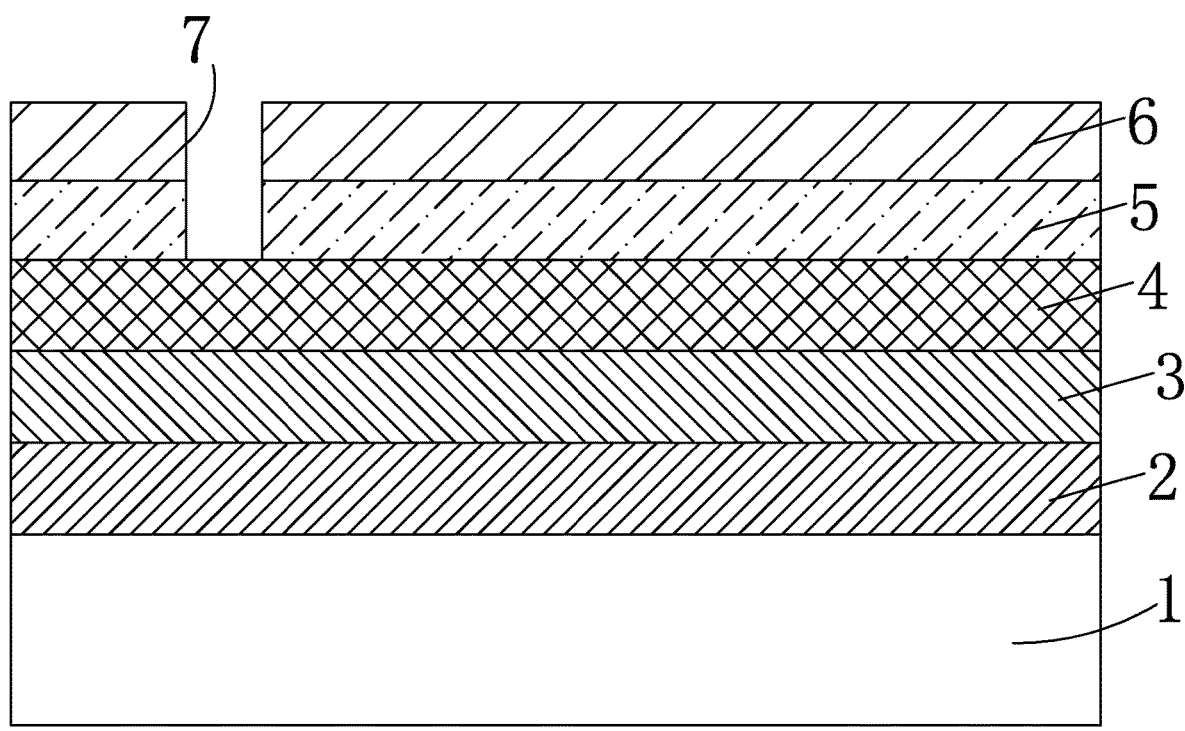
FIG. 5 is a schematic view illustrating Step S4 of the method for manufacturing a flexible array substrate according to the present invention.

Step S4: referring to FIG. 5, forming a via 7 in the flexible backing plate 6 to extend through the flexible backing plate 6 and the planarization layer 5.

Specifically, Step S4 may involve an operation of laser drilling or chemical corrosion to form the via 7. The via 7 has a diameter that is selected to match a diameter of a conductor to be received through the via 7, and preferably, the diameter of the via 7 is 5-100 micrometers.

Figure 6:
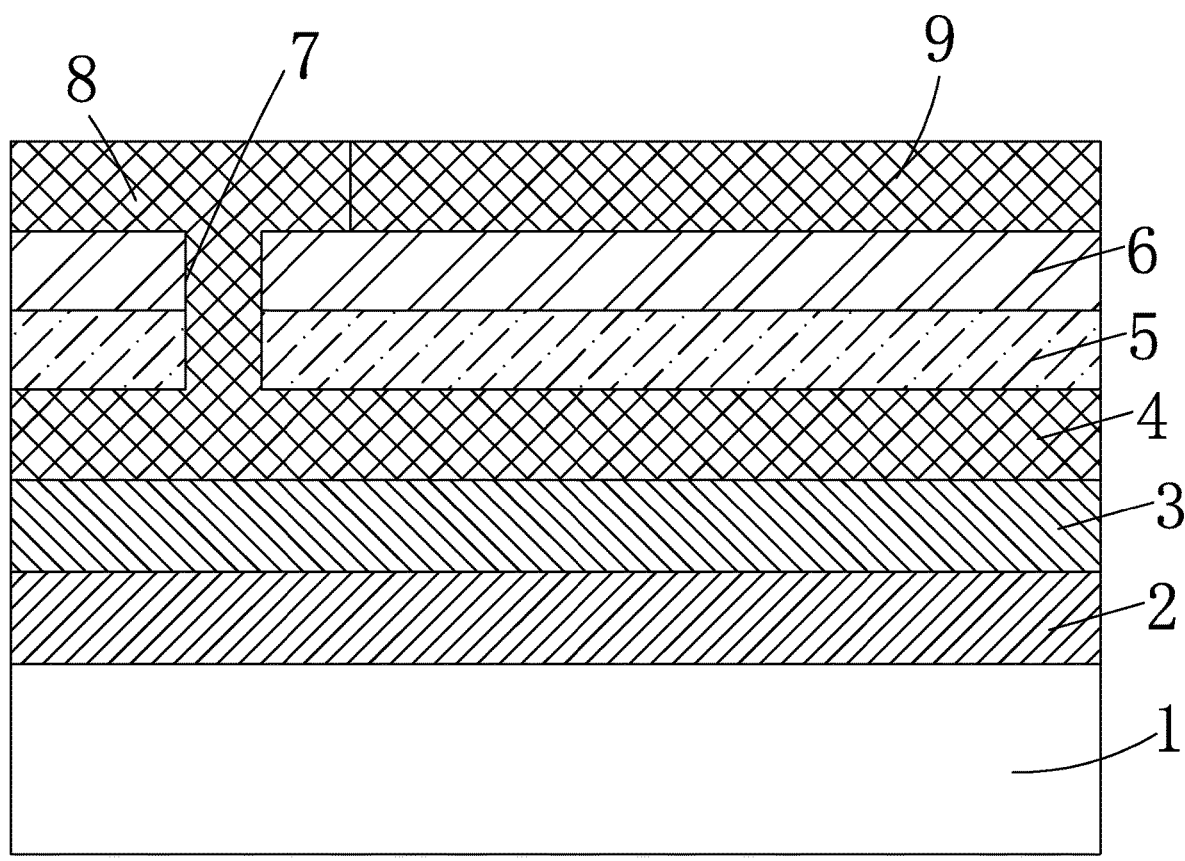
FIG. 6 is a schematic view illustrating Step S5 of the method for manufacturing a flexible array substrate according to the present invention.

Step S5: referring to FIG. 6, forming a front-side drive circuit 8 and a display circuit 9 that is in electrical connection with the front-side drive circuit 8 on the flexible backing plate 6, such that the front-side drive circuit 8 is electrically connected, through the via 7, to the back-side drive circuit 4.

Specifically, the front-side drive circuit 8 is formed on the flexible backing plate 6 in a predetermined area of a non-display zone, and the display circuit 9 is formed on the flexible backing plate 6 in a predetermined area of a display zone, wherein the display zone is located at a central area of the flexible backing plate 6 and the non-display zone surrounds the display zone.

Optionally, the flexible array substrate may adopt a configuration of externally connecting drive chips. The front-side drive circuit 8 and the back-side drive circuit 4 collectively form wire-on-array (WOA) lines of the flexible array substrate and the display circuit 9 comprises a plurality of data lines and a plurality of scan lines, wherein the plurality of data lines and the plurality of scan lines perpendicularly intersect to form a plurality of pixel units. Each of the WOA lines is corresponding to and electrically connected to one of the data lines or one of the scan lines, and each of the WOA lines receives a scan signal or a data signal from an external source for subsequent transmission to the corresponding one of the scan lines or the data lines for achieving image displaying.

Optionally, the flexible array substrate may adopt a gate-driver-on-array (GOA) configuration. The front-side drive circuit 8 and the back-side drive circuit 4 collectively form the WOA lines and a GOA circuit of the flexible array substrate, wherein the GOA circuit comprises a plurality of GOA units respectively corresponding to the scan lines. Each of the WOA lines is corresponding to and electrically connected to one of the data lines or one of the GOA units. Each of the WOA lines receives a signal from an external source and subsequently transmits the signal to the GOA units to generate a scan signal that is subsequently transmitted to the scan lines or receives a data signal that is transmitted to the data lines, so as to achieve image displaying. Adoption of the GOA technique make it possible to omit connection with external driver chips so as to further reduce a width of a bezel of a display device.

Figure 7:
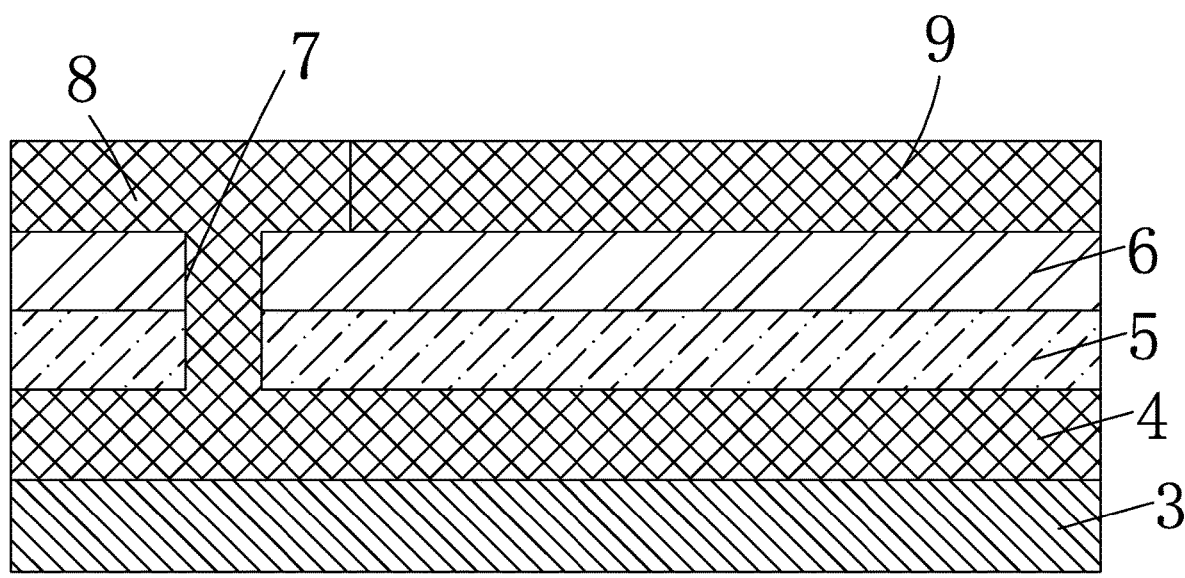
FIG. 7 is a schematic view illustrating Step S6 of the method for manufacturing a flexible array substrate according to the present invention.

Step S6: referring to FIG. 7, peeling off the rigid support plate 1 and the adhesive layer 2 to obtain a flexible array substrate.

Specifically, Step S6 involves an operation of laser peeling to peel off the rigid support plate 1 and the adhesive layer 2.

Further, with the above technique, the circuit structure (which may comprise a WOA circuit and a GOA circuit) of a non-display zone is distributed to two surfaces of the flexible backing plate, so that compared to an arrangement where the circuit structure of the non-display zone is completely set on the same surface of the flexible backing plate, a laying area occupied by the circuit structure of the non-display zone can be greatly reduced and thus, the width occupied by the non-display zone can be reduced to help achieve ultra-slim bezel or bezel-free displaying.

Importantly, in the above-described method, a flexible array substrate having a double-sized circuit structure is formed by first forming a back-side drive circuit 4, then forming a flexible backing plate 6 on the back-side drive circuit 4, and finally forming a front-side drive circuit 8 and a display circuit 9 on the flexible backing plate 6 and, as compared to the prior art, the entire process requires no steps of peeling, reversing, and then re-attaching of the flexible backing plate 6 so that it is possible to avoid the issues of poor flatness and low yield resulting from improper or wrongful re-attachment of the flexible backing plate 6 and thus, fabrication difficulty of a flexible array substrate having a double-sided circuit structure may be lowered down to thereby improve fabrication yield of the flexible array substrate.

In summary, the present invention provides a method for manufacturing a flexible array substrate. The method comprises, first, successively forming an adhesive layer, a passivation layer, a back-side drive circuit, a planarization layer, a flexible backing plate, and a front-side drive circuit and a display circuit, in a stacked arrangement, on a rigid support plate and then peeling off the rigid support plate and the adhesive layer to form a flexible array substrate having a double-sided circuit structure. The entire process requires no steps of peeling, reversing, and then re-attaching of the flexible backing plate so that it is possible to avoid the issues of poor flatness and low yield resulting from improper or wrongful re-attachment of the flexible backing plate and thus, fabrication difficulty of a flexible array substrate having a double-sided circuit structure may be lowered down to thereby improve fabrication yield of the flexible array substrate.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A method for manufacturing a flexible array substrate, comprising the following steps:
   Step S1: providing a rigid support plate, forming an adhesive layer on the rigid support plate, and forming a passivation layer on the adhesive layer;
   Step S2: forming a back-side drive circuit on the passivation layer and covering the back-side drive circuit with a planarization layer;
   Step S3: forming a flexible backing plate on the planarization layer;
   Step S4: forming a conductive via in the flexible backing plate to extend through the flexible backing plate and the planarization layer;
   Step S5: forming a front-side drive circuit and a display circuit on the flexible backing plate, the display circuit being in electrical connection with the front-side drive circuit, such that the front-side drive circuit is electrically connected, through the via, to the back-side drive circuit; and
   Step S6: peeling off the rigid support plate and the adhesive layer to obtain the flexible array substrate.

2. The method for manufacturing a flexible array substrate as claimed in claim 1, wherein the rigid support plate is made of glass.

3. The method for manufacturing a flexible array substrate as claimed in claim 1, wherein the flexible backing plate is made of a material comprising polyimide, polyethylene terephthalate, cyclic olefin copolymer, or polyethersulfone resin.

4. The method for manufacturing a flexible array substrate as claimed in claim 1, wherein the flexible backing plate has a thickness of 5-500 micrometers.

5. The method for manufacturing a flexible array substrate as claimed in claim 1, wherein Step S4 uses an operation of laser drilling or chemical corrosion to form the via.

6. The method for manufacturing a flexible array substrate as claimed in claim 1, wherein the via has a diameter of 5-100 micrometers.

7. The method for manufacturing a flexible array substrate as claimed in claim 1, wherein Step S6 uses an operation of laser peeling to peel off the rigid support plate and the adhesive layer.

8. The method for manufacturing a flexible array substrate as claimed in claim 1, wherein Step S3 uses an operation of coating or attachment to form the flexible backing plate on the planarization layer.

9. The method for manufacturing a flexible array substrate as claimed in claim 1, wherein the front-side drive circuit and the back-side drive circuit collectively form wire-on-array (WOA) lines on the flexible array substrate.

10. The method for manufacturing a flexible array substrate as claimed in claim 1, wherein the front-side drive circuit and the back-side drive circuit collectively form wire-on-array (WOA) lines and a gate-driver-on-array (GOA) circuit of the flexible array substrate.

* * * * *